United States Patent
Chen

(10) Patent No.: US 10,203,398 B2
(45) Date of Patent: Feb. 12, 2019

(54) OPTICAL PROXIMITY SENSOR AND MANUFACTURING METHOD THEREOF

(71) Applicant: DAPA INC., Taoyuan (TW)

(72) Inventor: Ting-Yi Chen, Taoyuan (TW)

(73) Assignee: Ting-Yi Chen, Taoyuan City (TW)

( * ) Notice: Subject to any disclaimer, the term of this patent is extended or adjusted under 35 U.S.C. 154(b) by 0 days.

(21) Appl. No.: 15/882,074

(22) Filed: Jan. 29, 2018

(65) Prior Publication Data

US 2018/0164409 A1    Jun. 14, 2018

Related U.S. Application Data

(63) Continuation-in-part of application No. 15/145,917, filed on May 4, 2016.

(51) Int. Cl.
| | |
|---|---|
| *G01S 7/481* | (2006.01) |
| *G01S 17/08* | (2006.01) |
| *G01J 1/02* | (2006.01) |
| *H01L 25/16* | (2006.01) |
| *H01L 31/167* | (2006.01) |
| *H01L 31/02* | (2006.01) |
| *G01J 1/42* | (2006.01) |

(Continued)

(52) U.S. Cl.
CPC .............. *G01S 7/4813* (2013.01); *G01J 1/02* (2013.01); *G01J 1/0271* (2013.01); *G01J 1/42* (2013.01); *G01J 1/4204* (2013.01); *G01S 7/4814* (2013.01); *G01S 7/4816* (2013.01); *G01S 17/023* (2013.01); *G01S 17/026* (2013.01); *G01S 17/08* (2013.01); *H01L 25/16* (2013.01); *H01L 25/165* (2013.01); *H01L 25/167* (2013.01); *H01L 31/0203* (2013.01); *H01L 31/02005* (2013.01); *H01L 31/02019* (2013.01); *H01L 31/02325* (2013.01); *H01L 31/167* (2013.01); *H01L 24/48* (2013.01); *H01L 2224/48091* (2013.01); *H01L 2224/48106* (2013.01); *H01L 2224/48145* (2013.01); *H01L 2224/48227* (2013.01); *H01L 2924/12041* (2013.01); *H01L 2924/12042* (2013.01); *H01L 2924/12043* (2013.01); *H01L 2924/1433* (2013.01)

(58) Field of Classification Search
CPC .... G01J 1/0204; G01J 1/44; G01J 1/04; G01J 1/08; G01J 1/4204; H01L 25/165; H01L 25/167; H01S 5/183; H01S 5/02248
See application file for complete search history.

(56) References Cited

U.S. PATENT DOCUMENTS 8,350,216 B2 * 1/2013 Yao .................... G01J 1/32
                                                         250/339.01

* cited by examiner

*Primary Examiner* — Christine S Kim
(74) *Attorney, Agent, or Firm* — Rosenberg, Klein & Lee

(57) ABSTRACT

A complex optical proximity sensor includes a substrate, a light emitter coupled to the substrate, an application-specific integrated circuit chip coupled to the substrate, a proximity sensor embedded in the application-specific integrated circuit chip, a barrier disposed between the application-specific integrated circuit chip and the light emitter, and an ambient light detection chip manufactured in advance and then coupled to the application-specific integrated circuit chip thereon with a pre-determined height. The elements are disposed within a limited area of an aperture and, with a manufacturing method of the complex optical proximity sensor, the detection angle of the ambient light is thereby maximized and the detection angle of the proximity sensor is thereby minimized.

16 Claims, 16 Drawing Sheets

(51) Int. Cl.
*G01S 17/02* (2006.01)
*H01L 31/0203* (2014.01)
*H01L 31/0232* (2014.01)
*H01L 23/00* (2006.01)

OCR of US 10,203,398 B2

OPTICAL PROXIMITY SENSOR AND MANUFACTURING METHOD THEREOF

This patent application is a continuation-in-part of Ser. No. 15/145,917 filed on May 4, 2016, currently pending.

BACKGROUND OF THE INVENTION

1. Field of the Invention

The invention relates to an optical proximity sensor and a manufacturing method thereof that is installed on a substrate of a smartphone and performs detection through an aperture on a front surface of the smartphone, so as to minimize the angle of proximity detection and maximize the angle of ambient light detection.

2. Description of the Related Art

Smart mobile devices such as smartphones usually have an ambient light sensor (ALS) for ambient light detection to adjust brightness of the touchscreen for energy-saving; such devices also have a proximity sensor (PS) and a light emitter for proximity detection to automatically close the touchscreen in case of inadvertent operations when a user's face is close to the touchscreen during a call. The ALS and PS are both applications of light detection and therefore can be integrated into one package with the light emitter for less installation space, less manufacturing materials, and combined arrangement for circuits. The ALS and PS are usually disposed aside a display panel of a smart mobile device. Referring to FIGS. 1A and 1B, a smartphone P therefore has different openings on a front panel thereof for different ALS and PS structures—an elongated hole $G_1$ as in FIG. 1A or a circular hole $G_2$ as in FIG. 1B.

As smart mobile devices are getting more popular, the appearance design is getting more important. Nowadays it is preferred to have an aperture as small as possible on a front surface of smart mobile devices, and the structures must share one aperture on a smart mobile device if they are to be integrated. However, ALS and PS have different factors to be considered in application. A detection angle of the ALS has to be as wide as possible while a detection angle of the PS and light emitter has to be as narrow as possible. The opening on the smartphone P was an elongated hole $G_1$ as shown in FIG. 1A, and then it was designed to be a circular hole $G_2$ as shown in FIG. 1B to meet a favorable design expected by the consumers regardless of a consequence of narrower detection angle for ambient light.

A structure of an optical proximity sensing package 10 is illustrated in FIG. 2 in which ALS and PS are arranged laterally. The optical proximity sensing package 10 includes a substrate 11, an infrared (IR) LED 12 disposed on the substrate 11, and a detection unit 13 disposed on the substrate 11 with a proximity sensor 131 and an ambient light sensor 132 thereon. A barrier 14 is arranged between the IR LED 12 and the detection unit 13 to avoid interferences from the IR LED 12 to the proximity sensor 131. When the IR LED 12 emits light to be reflected by an object O to the proximity sensor 131, a proximity detection angle $\theta_{a1}$ is formed; the proximity sensor 131 is disposed near the left of the ambient light sensor 132 so that the proximity detection angle $\theta_{a1}$ cannot be too narrow. The ambient light sensor 132 has the barrier 14 blocking its detection angle; therefore the ambient light detection angle $\theta_{b1}$ cannot be too wide. With such arrangement, the proximity detection angle $\theta_{a1}$ and the ambient light detection angle $\theta_{b1}$ are coordinated to be a medium number for operation. Such structure has a distance from the IR LED 12 to the proximity sensor 131 and the ambient light sensor 132, therefore requires an elongated hole $G_1$ to be arranged on a front surface of the smartphone P with a large aperture $T_1$.

FIG. 3 illustrated a package-on-package (POP) optical sensor 20 disclosed in U.S. Pat. No. 8,143,608. The POP optical sensor 20 includes an IR light emitter 211 disposed on a first substrate 21, a light detector 221 disposed on a second substrate 22 together with an ambient light detector 222, and an integrated circuit disposed on a third substrate 23 and encapsulated by an overmolding material 24, including a light emitter driver circuit, a light detection circuit, and an ambient light detection circuit. The first and second substrates 21, 22 both have wire bond pads 212, 223, 224, and the third substrate 23 further includes at least first, second and third sets of wire bond pads 231, 232, 233 uncovered by the overmolding material 24 and electrically connected to the integrated circuit. The IR light emitter 211 is electrically connected to the light emitter driver circuit via the wire bond pads 212 on the first substrate 21, a wire 25, and the first set of wire bond pads 231; the light detector 221 and the ambient light detector 222 are electrically connected to the light detection circuit and ambient light detection circuit via the wire bond pads 223, 224 on the second substrate 22, a wire 25, and the second and third set of wire bond pads 232, 233. A first molded IR pass component 26 including a lens 261 by molding is further disposed on and covers the IR light emitter 211. A second molded IR pass component 27 including a lens 271 by molding is further disposed on and covers the light detector 221 and ambient light detector 222. A molded IR cut component 28 is further disposed between partial of the third substrate 23 and the first and second IR pass component 26, 27 and covers the mentioned area.

With the structures disclosed, the IR light emitter 211 would not interfere with the light detector 221 and a proximity detection angle $\theta_{a2}$ is formed when the IR light emitter 211 emits light which is reflected by an object O to the light detector 221. The proximity detection angle $\theta_{a2}$ remains the same with comparison to the conventional optical proximity sensor package 10 since the ambient light detector 222 is disposed between the IR light emitter 211 and the light detector 221. However, such structure is still in lateral arrangement and still has quite a distance between the IR light emitter 211 and the light detector 221. Therefore, it still requires an elongated hole $G_1$ arranged on a front surface of a smartphone P with a large aperture $T_1$.

FIG. 4 illustrated a photosensor chip package structure 30 disclosed in U.S. Pat. No. 8,716,722. The package structure includes an opaque substrate 31, a light emitting chip 32, and a photosensor chip 33 including an ambient light detection unit 331 and a proximity sensor 332.

The opaque substrate 31 has a first basin 311 on a surface thereof, a second basin 312 on a reverse surface thereof, and a light guiding channel 313 connecting through the first basin 311 and the second basin 312. The second basin 312 and the light guiding channel 313 both have a reflection layer 34. The light emitting chip 32 is disposed in the first basin 311 and covered by a translucent first sealant material 35 filled therein. The photosensor chip 33 is disposed in the second basin 312, fixed by a plurality of metal blocks 37, and covered by a translucent second sealant material 36 which is also filled in the light guiding channel 313.

With the structures disclosed, the light emitting chip 32 would not interfere with the proximity sensor 332. When a light emitted by the light emitting chip 32 is reflected by an object O to the proximity sensor 332, a proximity detection angle $\theta_{a3}$ is formed; and the photosensor chip 33 receives ambient light L by the light guiding channel 313 with a pre-determined arrangement of detection angle $\theta_{b3}$ for operation. In addition, the first basin 311 overlaps on partial of the second basin 312 so that the distance from the light emitting chip 32 to the ambient light detection unit 331 and proximity sensor 332 is improved to be shortened, resulting in narrow detection angle of the proximity detection and the ambient light detection. Such structure also enables a favorable circular hole $G_2$ to be arranged on a front surface of a smartphone P with a small aperture $T_2$. Nevertheless, the ambient light detection range becomes a defect since the detection angle cannot reach a suitable and efficient range for operation.

FIGS. 5A-5D displayed an optical proximity sensor 50 that has its ALS and PS structures arranged vertically. The device is an AVAGO TECHNOLOGIES™ APDS-9800 Integrated Ambient Light and Proximity Sensor, including a substrate 51 with a LED 52 mounted thereon, a light detector 53, an ambient light detector 54, two metal covers 55 covering the LED 52, the light detector 53 and the ambient light detector 54, and a barrier 56. The LED 52 and the light detector 53 are disposed at one side of the barrier 56 and the ambient light detector 54 is disposed at the other side of the barrier 56. The reason for having the barrier 56 is shown in FIG. 5B. An optically transmissive material 57 is disposed between the LED 52 and the light detector 53; when the light 521 of the LED 52 goes through the optically transmissive material 57, optical noises 58 are produced due to refraction and reflection and the light detector 54 receives the optical noises 58 as well during detection. The same phenomena occur when the optical proximity sensor 50 is performing detection while it is disposed under a window 59 of a smartphone (not shown) as shown in FIG. 5C. When the optical proximity sensor 50 has the barrier 56 disposed therein as shown in FIG. 5D, the optical noises 58 are less possibly detected by the light detector 53.

FIGS. 6A-6B illustrated an optical proximity sensor 60 disclosed in U.S. Pat. No. 8,350,216, having its ALS and PS structures laterally arranged and disposed under an elongated opening $G_1$ with a diameter $T_1$. The optical proximity sensor 60 includes a substrate 61 having a plurality of bond pads 611 thereon, a light emitter 62 mounted on the substrate 61 and electrically connected to at least one of the bond pads 611, an application-specific integrated circuit (ASIC) chip 63 mounted on the substrate 61 and electrically connected to at least one of the bond pads 611, a first and a second spacer 64, 65 individually disposed on the ASIC chip 63, an ambient light detector 66 disposed on the first spacer 64 and electrically connected to at least one of the bond pads 611, a light detector 67 disposed on the second spacer 65 and electrically connected to at least one of the bond pads 611, and a barrier 68 disposed between the light emitter 62 and the ambient light detector 66. A proximity detection angle $\theta_{a5}$ is formed when a light is emitted from the light emitter 62 and reflected to the light detector 67; and the ambient light detector 66 has a detection angle $\theta_{b5}$ for receiving ambient light L. When the optical proximity sensor 60 is in operation, the proximity detection angle $\theta_{a5}$ is thereby a medium angle and the distance between the light emitter 62 and the light detector 67 cannot be shortened thereby. More importantly, the opening of a smartphone P where the optical proximity sensor 60 is placed under is an elongated hole $G_1$ with a relatively longer diameter $T_1$.

FIGS. 7A-7B illustrated a virtual optical proximity sensor 70 when the optical proximity sensor 60 disclosed in FIGS. 6A-6B is combined with the optical proximity sensor 50 disclosed in FIGS. 5A-5D. The virtual optical proximity sensor 70 includes a substrate 71, a light emitter 72 mounted on the substrate 71, a ASIC chip 73 mounted on the substrate 71, a first spacer 74 disposed on the ASIC chip 73, a second spacer 75 disposed on the ASIC chip 73 and arranged at the same height as the first spacer 74, an ambient light detector 76 disposed on the first spacer 74, a light detector 77 disposed on the second spacer 75 to be at the same height as the ambient light detector 77, and a barrier 78 disposed between the light emitter 72 and the light detector 77. When the light is emitted from the light emitter 72 and reflected from an object O to the light detector 77, a proximity detection angle $\theta_{a5}$ is formed; meanwhile, the light goes through a glass layer V of a smartphone P and is refracted at a first surface $V_1$ of the glass layer V at a refraction angle $\theta_{n1}$, forming a first optical noise $N_1$, and then refracted at a first surface $V_2$ of the glass layer V at a refraction angle $\theta_{n2}$, forming a second optical noise $N_2$. In order to present a small aperture with a shorter diameter $T_2$ on the smartphone P, the light detector 77 has to be arranged close to the barrier 78 and elevated by the second spacer 75. However, the light detector 77 is consequently prone to receive the first and second optical noises $N_1$, $N_2$, even with the design of the barrier 78.

On the other hand, there is another structure to have a module including the PS and light emitter operated through a circular opening and another module with ALS operated through another circular opening on a front surface of a smartphone. The appearance may still be favorable to the consumers, but such structure requires a large number of volumes to be installed on a smartphone, resulting in another defect for improvement.

All in all, it is desirable to improve the defects described above and find a manufacturing method that would allow a maximized detection angle for ALS structures—in the prior cases, the ambient light sensor 132, the ambient light detector 222, the ambient light detection unit 331 and the light detector 53, 67, 77—and a minimized detection angle for PS structures—in the prior cases, the IR LED 12, the IR light emitter 211, and the light emitting chip 32, the LED 52, and the light emitter 67, 77—that would allow the entire structure to operate detection under a small aperture opening on a front surface of a smart mobile device.

SUMMARY OF THE INVENTION

It is a primary object of the present invention to provide an optical proximity sensor and a manufacturing method thereof that has an isolated ambient light detection chip as an ambient light sensor (ALS) isolated from a circuit of the proximity sensor (PS) so that the distances from the ambient light detection chip and from the proximity sensor to a light emitter are both shortened. Also, with a circular opening as an aperture on a front surface of a smart device, the present invention is able to sophisticatedly perform detections with a minimized detection angle of the PS structure and a maximized detection angle of the ALS structure.

In order to achieve the objects above, the complex optical proximity sensor comprises a substrate; a light emitter coupled to the substrate; an application-specific integrated circuit (ASIC) chip disposed on the substrate and coupled thereto; a proximity sensor (PS) being embedded in the application-specific integrated circuit chip and electrically connected thereto, the proximity sensor having a first detection surface sharing a common level surface with an upper surface of said application-specific integrated circuit chip, the substrate further including a barrier mounted between the light emitter and the application-specific integrated circuit chip, wherein a minimized distance is arranged between a center of the light emitter and a center of the proximity sensor so that the light emitter and the proximity sensor are adjacent to the barrier, and the application-specific integrated circuit chip is arranged with a minimized height to avoid receiving optical noise from other lighting sources other than the light emitter; and an ambient light detection chip separately manufactured and then coupled to the application-specific integrated circuit chip, the ambient light detection chip extending to a pre-determined height relative to a laterally extended surface of the application-specific integrated circuit chip; said ambient light detection chip having a second detection surface and being independently offset in position from the first detection surface of the proximity sensor for the first detection surface to be laterally spaced without being shielded by said second detection surface, wherein the offset position between the ambient light detection chip and the first detection surface of the proximity sensor is limited to a minimized distance between the second detection surface and the first detection surface, and the height of the ambient light detection chip is arranged to be a maximized height for the second detection surface to receive ambient light, thereby the ambient light detection chip, the light emitter and the proximity sensor are disposed within a limited area of an aperture to form the complex optical proximity sensor.

Whereby a light is emitted from the light emitter and reflected to the proximity sensor for detection; the barrier is arranged at a pre-determined height to prevent interference from the emitted light to the proximity sensor and the application-specific integrated circuit chip is arranged with the minimized height to prevent the first detection surface of the proximity sensor from receiving optical noise; and the ambient light detection chip is manufactured separately with the maximized height in accordance with the height of the barrier to minimize a detection angle of the proximity sensor and to maximize a detection angle of the ambient light detection chip with the first and second detection surfaces performing detections within the limited area of an aperture.

Additionally, the minimized distance between the light emitter and the proximity sensor is arranged between 0.5 mm to 2.0 mm. The minimized distance of the offset between the ambient light detection chip and the first detection surface of the proximity sensor is arranged between 0 mm to 1 mm. The minimized height of the application-specific integrated circuit chip is arranged between 0.05 mm to 0.3 mm. The maximized height of the ambient light detection chip is arranged between 0 mm to 1 mm, or it is arranged shorter than a difference between the height of the barrier and the minimized height of the application-specific integrated circuit chip.

Further with structures disclosed above, the ambient light detection chip is a chip for ambient light detection, RGB color detection, or ultraviolet (UV) detection, and the light emitter is a LED, a laser diode (LD), or a vertical-cavity surface-emitting laser (VCSEL).

The ASIC chip includes a plurality of first connect points disposed at right side of the ambient light detection chip and the first detection surface, forming an opening toward the ambient light detection chip and the first detection surface; the ambient light detection chip includes a plurality of second connect points disposed at right side of the ambient light detection chip; the substrate is either a ceramic substrate or a PCB for electric wire connections and includes a third connect point disposed below the light emitter and a plurality of fourth connect points disposed around the ASIC chip, said third connect point mutually coupled to each fourth connect point, each first connect points electrically connected to one of said second connect points and fourth connect points for the ASIC chip, the ambient light detection chip and the substrate to be mutually coupled, said third connect point further electrically connected to said light emitter which is coupled to the ASIC chip via the fourth connect points; said first connect points, second connect points, third connect point, and fourth connect points arranged in accordance to position of said ambient light detection chip, light emitter, and proximity sensor for performing detection within said limited area of an aperture.

The substrate further has a plurality of bond pads arranged under a bottom thereof to be coupled to the ASIC chip and the light emitter, making the complex optical proximity sensor a surface-mount device. A plurality of transparent packages is disposed on the substrate for the ambient light detection chip, the ASIC chip and the light emitter to be separately encapsulated therein, and a non-transparent package is disposed on the substrate for the barrier to be encapsulated therein. The material of transparent packages is made of lens.

As stated above, the ambient light detection chip is isolated and disposed on the ASIC chip with a pre-determined height thereon to maximize the detection angle for ambient light, and the proximity sensor is coupled to and installed on the ASIC chip to minimize the detection angle for proximity. The present invention thereby integrates the structures into one complex device performing detections via a small aperture on smart devices.

DETAILED DESCRIPTION OF THE PREFERRED EMBODIMENT

Figure 1A:
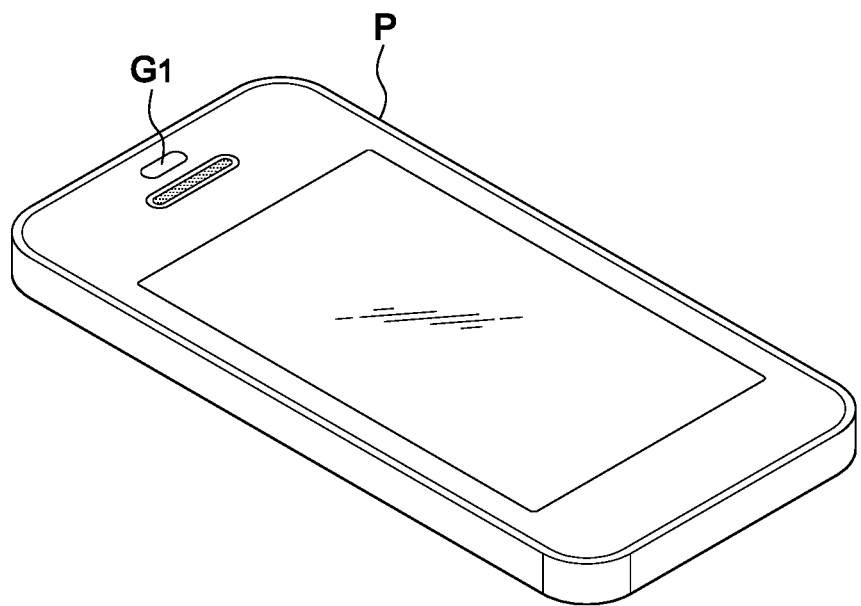
FIG. 1A is a schematic diagram of a smartphone with an elongated hole according to the prior art.
Figure 1B:
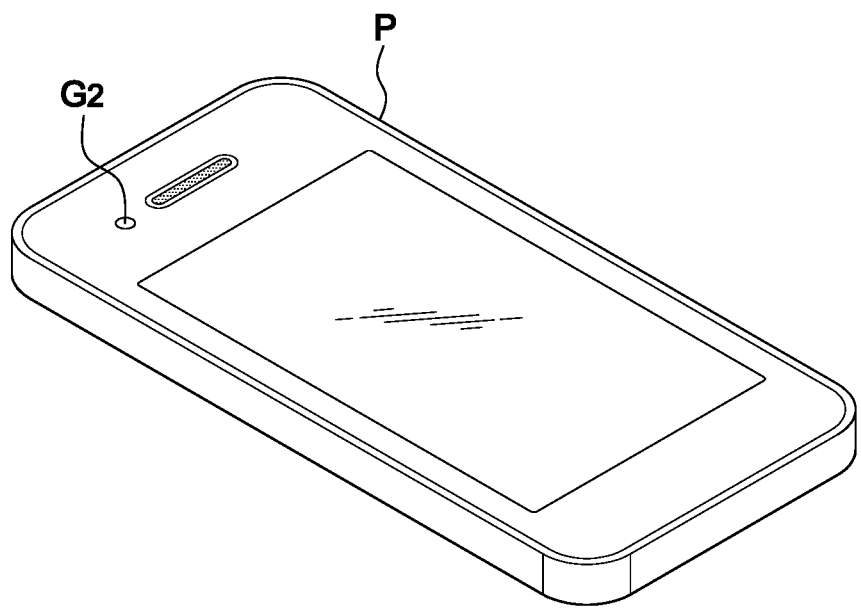
FIG. 1B is a schematic diagram of a smartphone with a circular hole according to the prior art.
Figure 2:
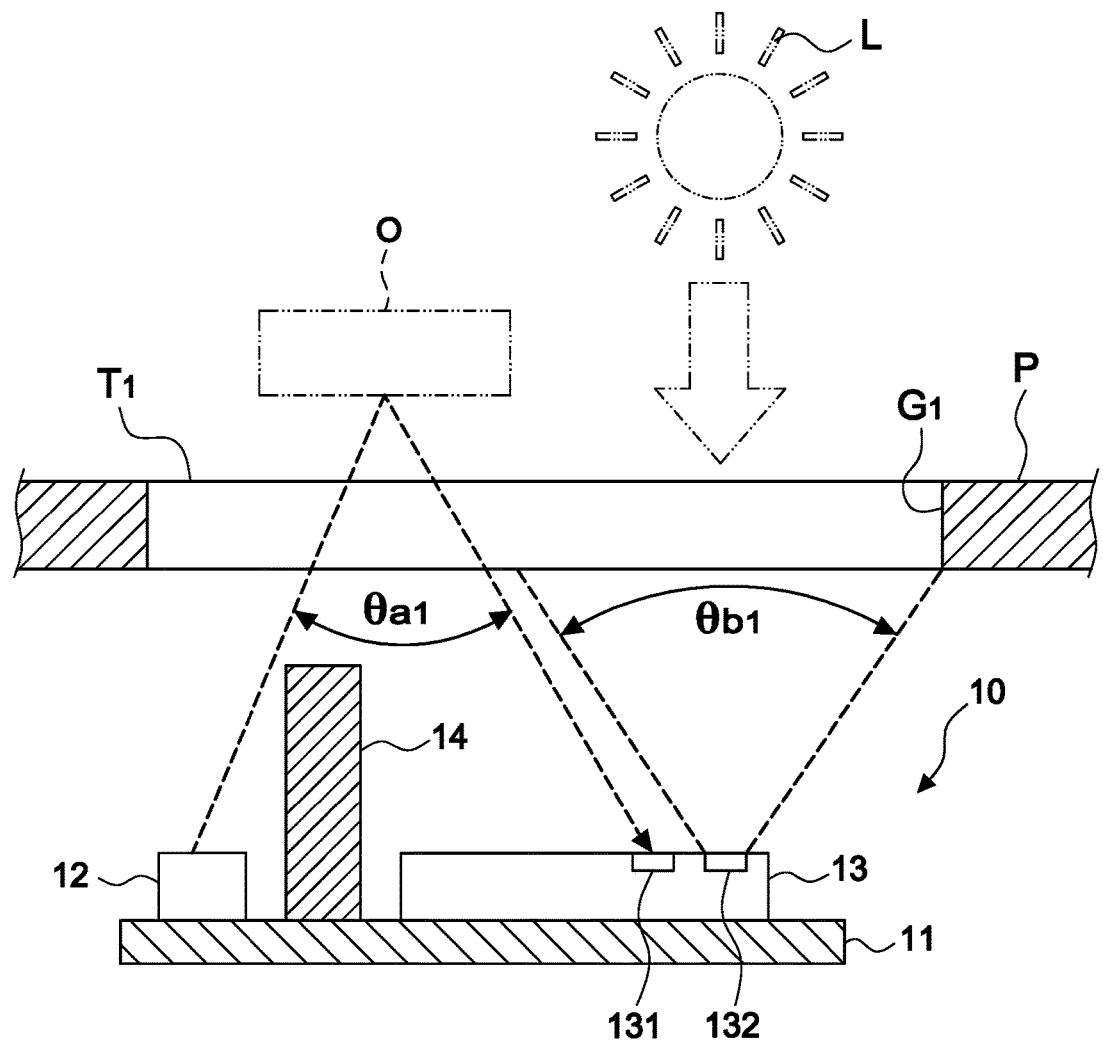
FIG. 2 is a schematic diagram illustrating a package structure of an optical proximity sensor according to the prior art.
Figure 3A:
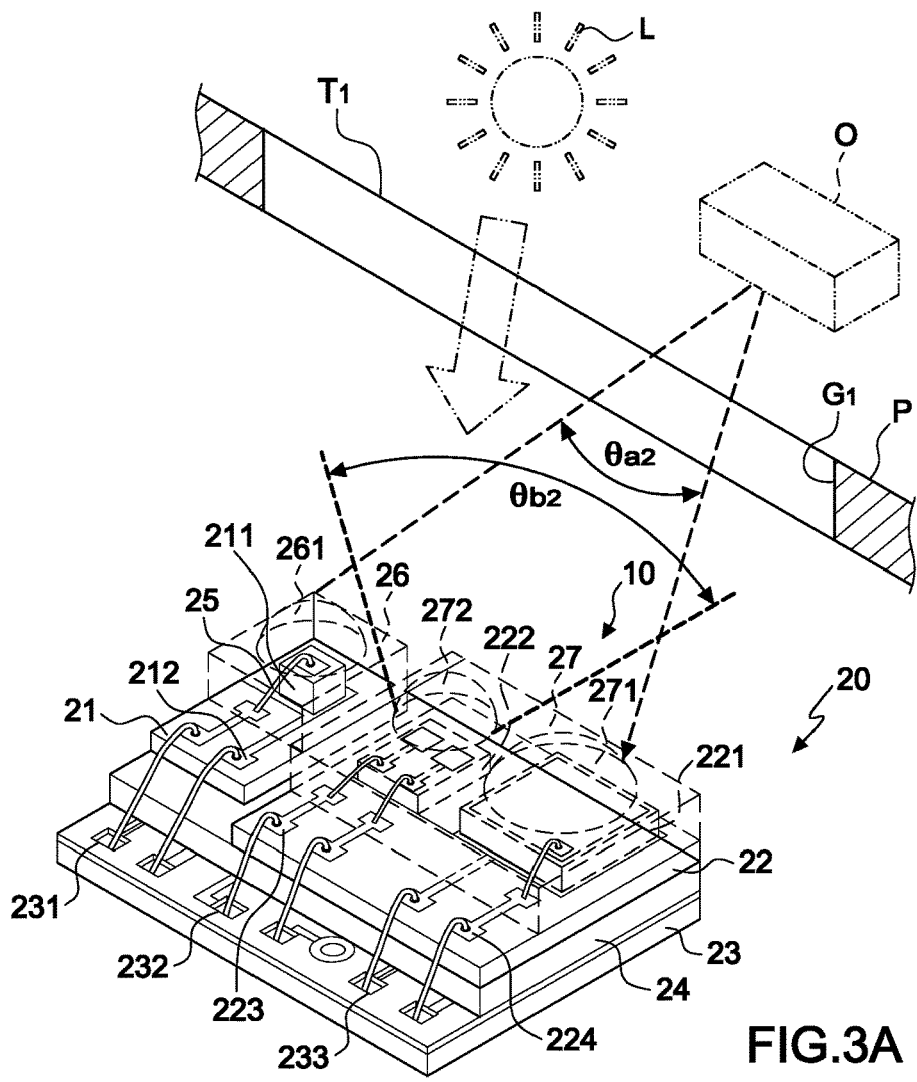
FIG. 3A is a schematic diagram illustrating a package-on-package structure of an optical proximity sensor according to the prior art.
Figure 3B:
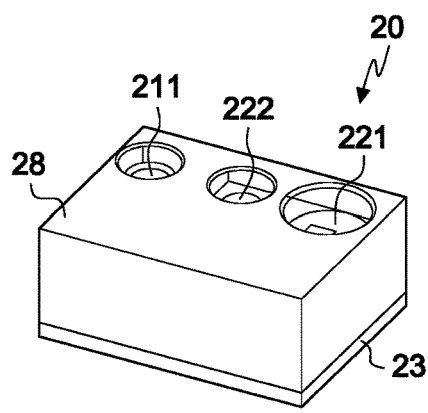
FIG. 3B is another schematic diagram illustrating the package-on-package structure of an optical proximity sensor in 3A.
Figure 4:
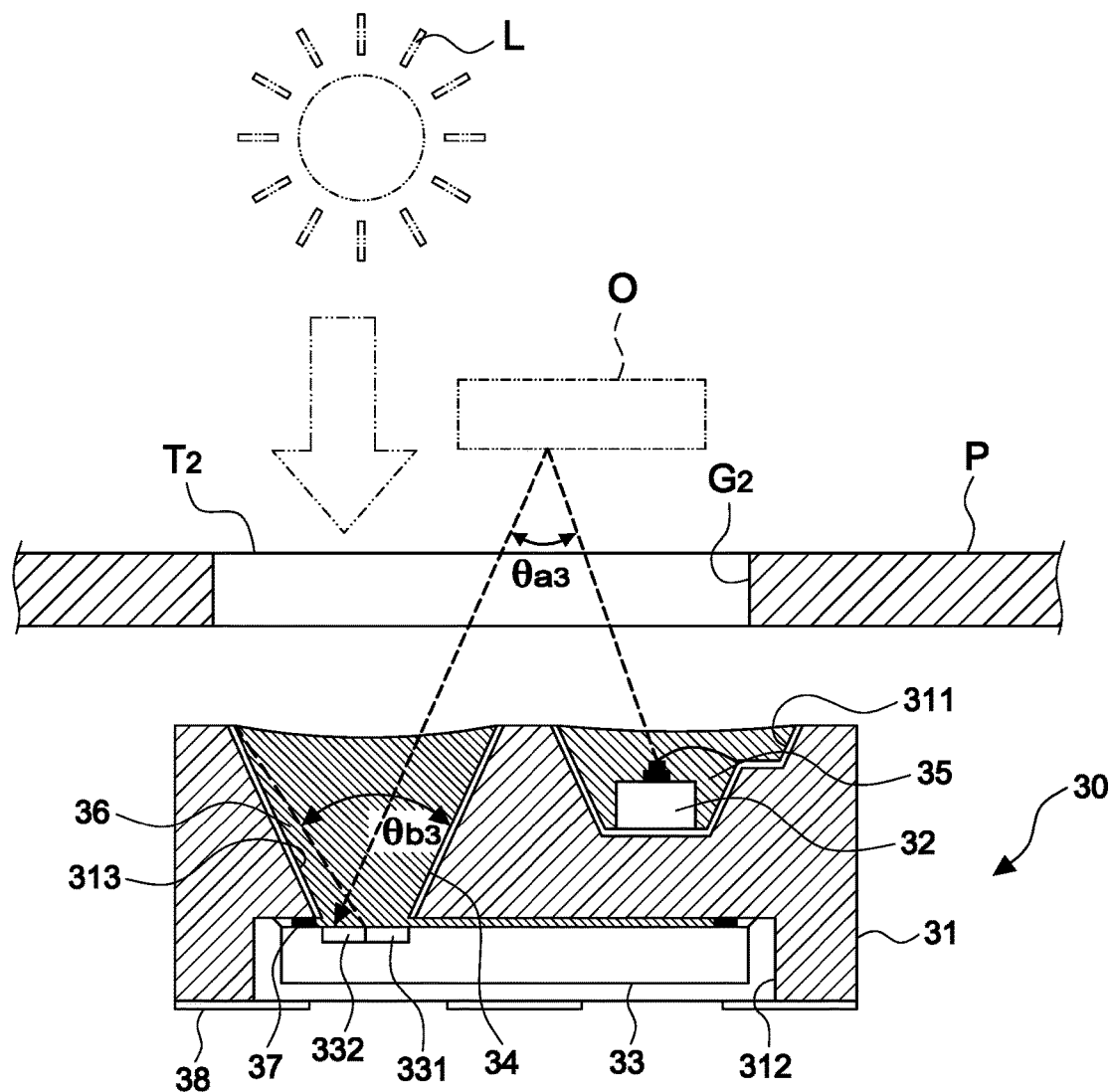
FIG. 4 is a schematic diagram illustrating a package structure of a photo sensor chip according to the prior art.
Figure 5A:
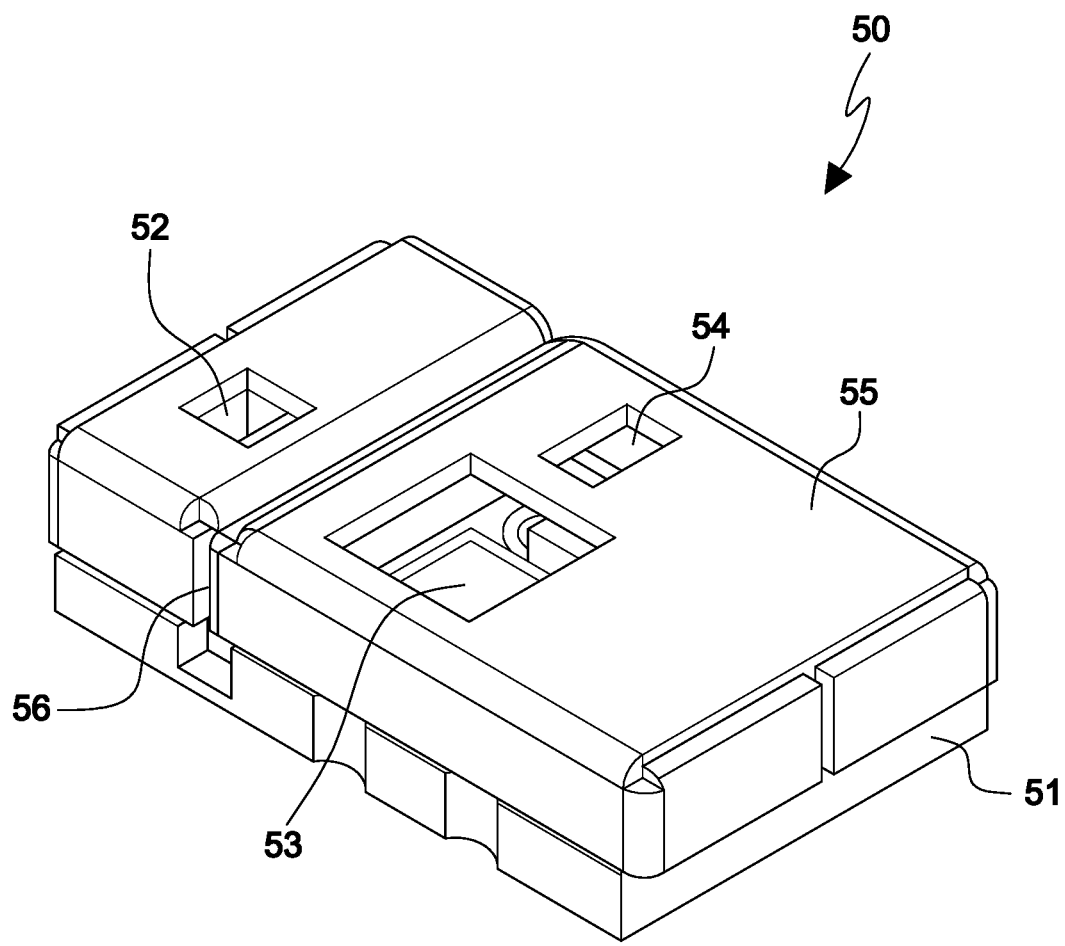
FIG. 5A is a perspective view of an optical proximity sensor according to the prior art.
Figure 5B:
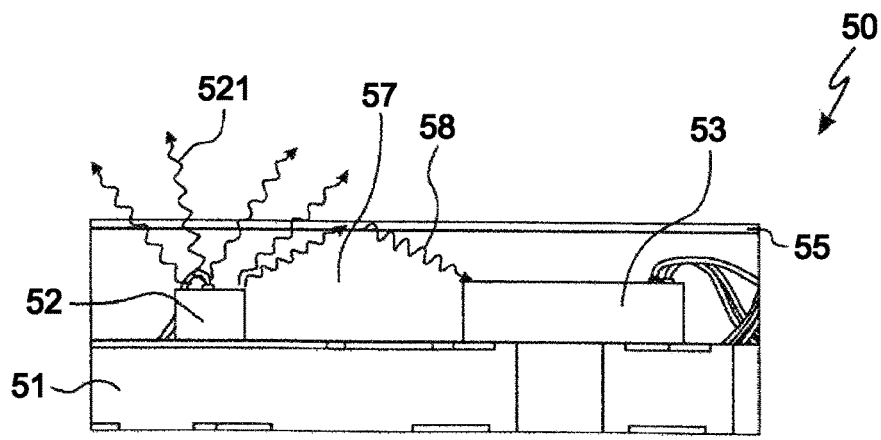
FIG. 5B is a schematic diagram illustrating optical noise according to the prior art.
Figure 5C:
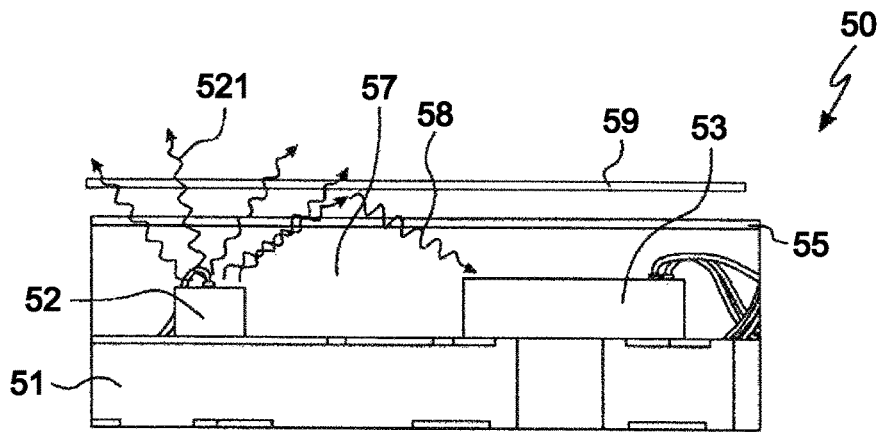
FIG. 5C is another schematic diagram illustrating optical noise according to the prior art.
Figure 5D:
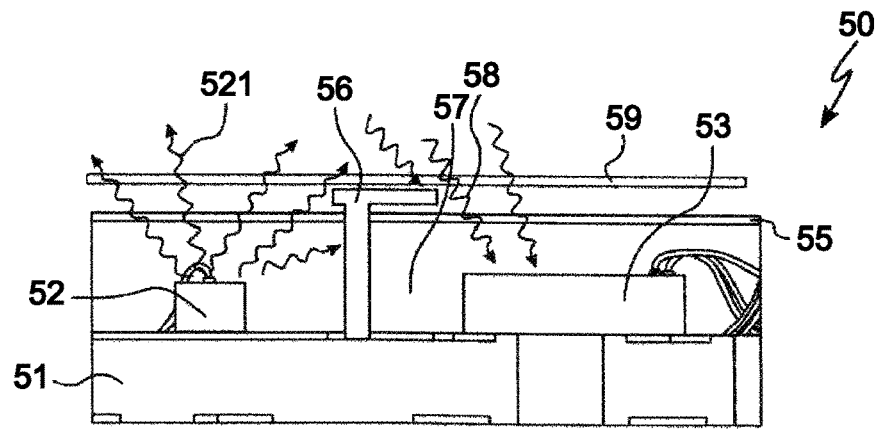
FIG. 5D is another schematic diagram illustrating optical noise according to the prior art.
Figure 6A:
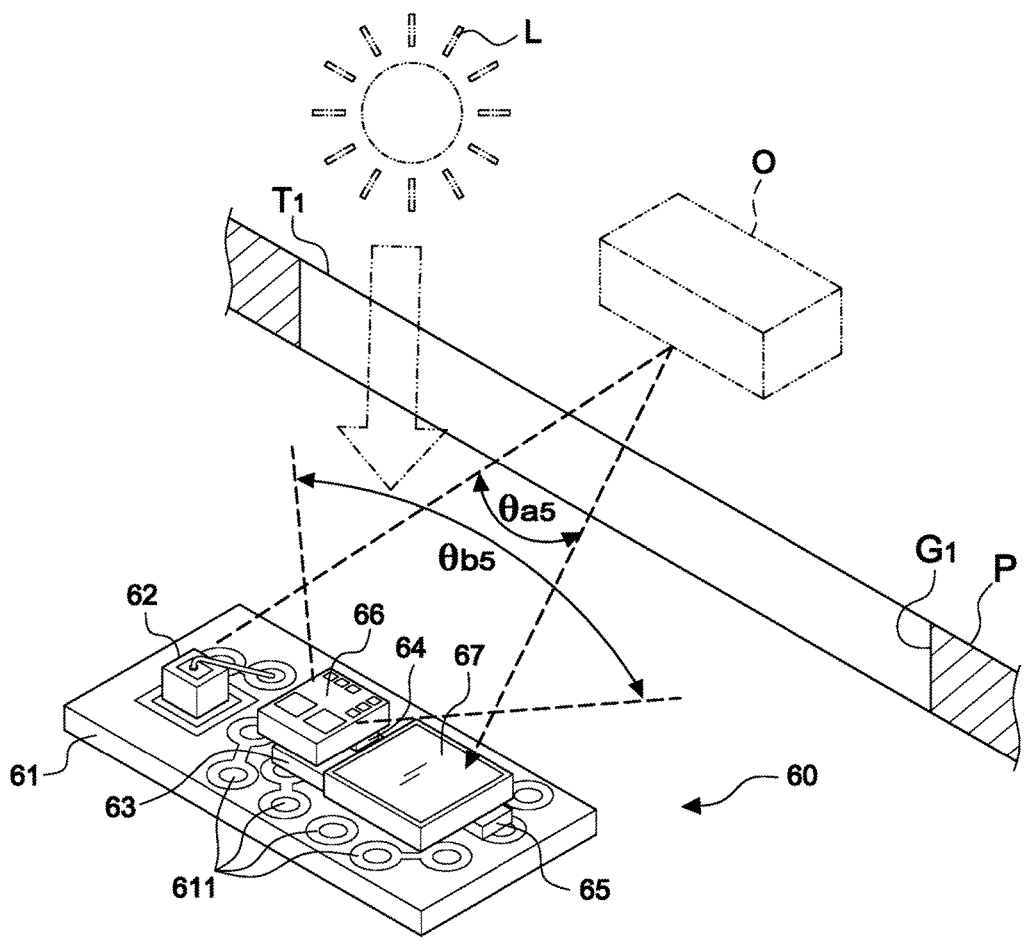
FIG. 6A is a schematic diagram illustrating another optical proximity sensor according to the prior art.
Figure 6B:
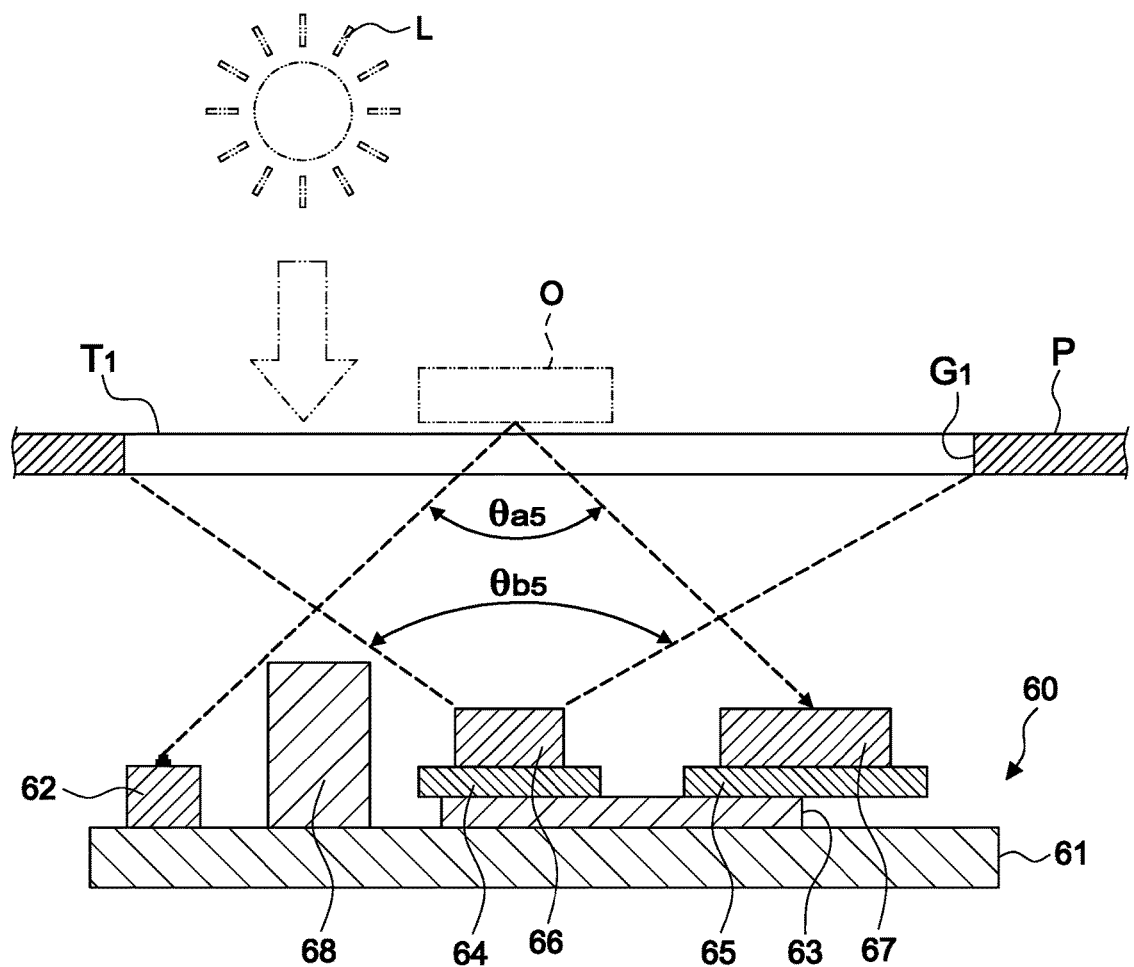
FIG. 6B is another schematic diagram illustrating yet another optical proximity sensor according to the prior art.
Figure 7A:
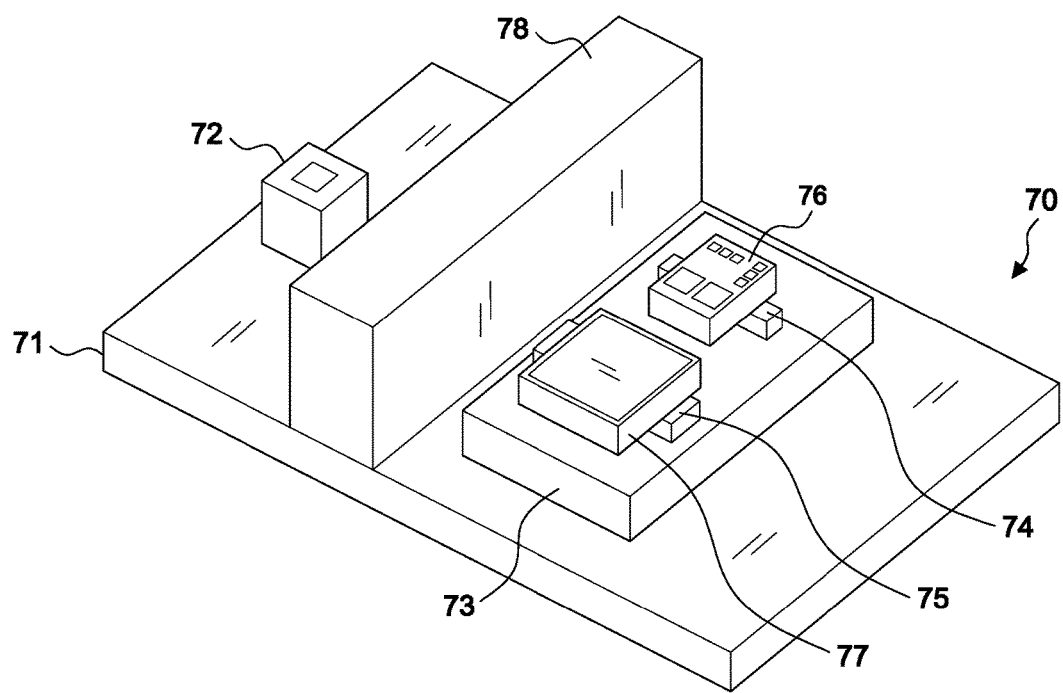
FIG. 7A is a virtual diagram of an optical proximity sensor according to the prior art.
Figure 7B:
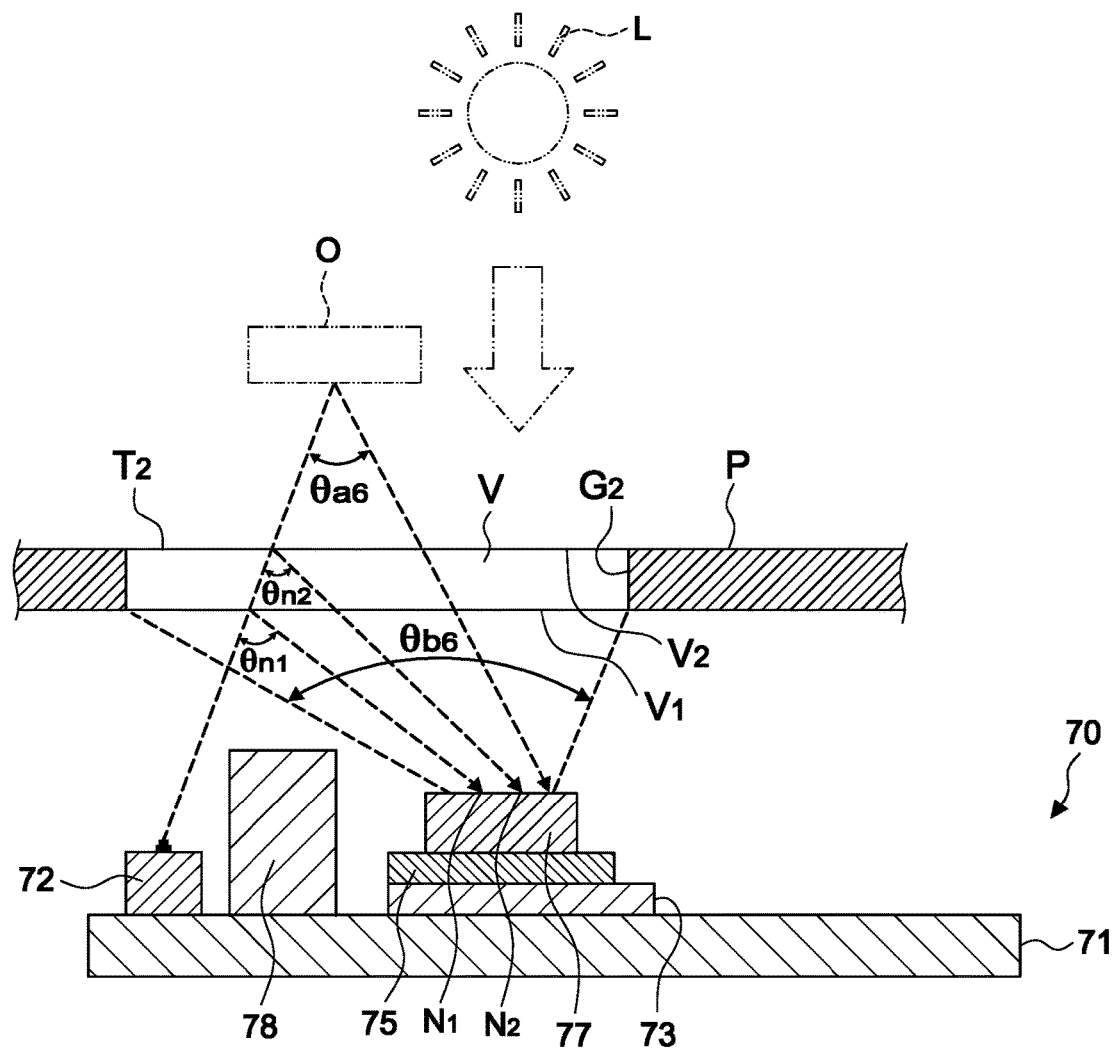
FIG. 7B is another virtual diagram of an optical proximity sensor according to the prior art.
Figure 8:
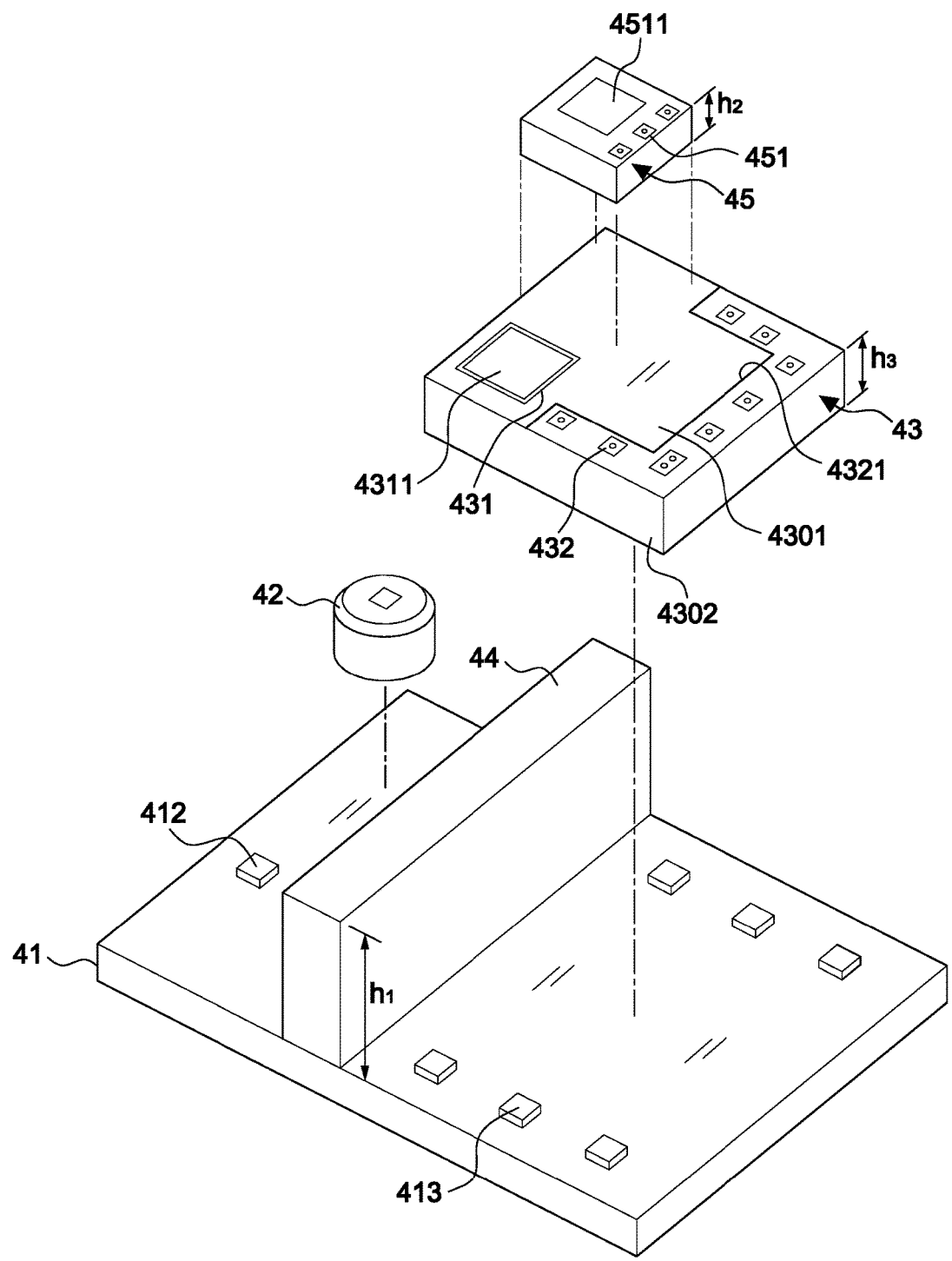
FIG. 8 is an exploded view of the present invention.
Figure 9:
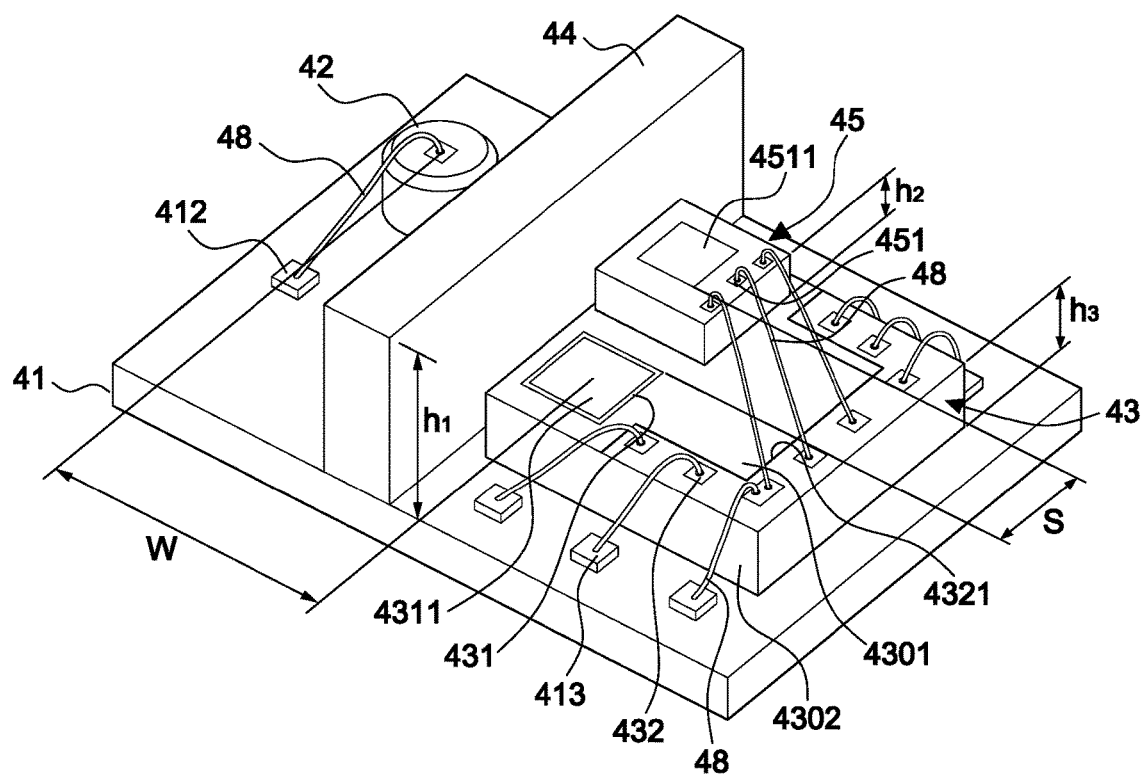
FIG. 9 is perspective view of the present invention.

FIGS. 8-14 illustrated a preferred embodiment of the present invention, a complex optical proximity sensor 40 that has a minimum detection angle for proximity $\theta_{a4}$ and a maximum detection angle for ambient light $\theta_{b4}$.

In the embodiment, the complex optical proximity sensor 40 includes a substrate 41, a light emitter 42, an application-specific integrated circuit (ASIC) chip 43, and an ambient light detection chip 45.

The substrate 41 is a ceramic substrate or a PCB, but it is not limited to such application. The light emitter 42 is coupled to the substrate 41 thereon by an electric wire 48. In this embodiment, the light emitter 42 is a LED, a laser diode (LD), or a vertical-cavity surface-emitting laser (VCSEL), but it is not limited to such application.

The ASIC chip 43 is disposed on and electrically coupled to the substrate 41 by an electric wire 48 and the proximity sensor 431 is embedded in the ASIC chip 43 and electrically connected therewith. The proximity sensor 431 has a first detection surface 4311 sharing a common level surface with an upper surface 4301 of the ASIC chip 43 and the substrate 41 further includes a barrier 44 mounted thereon between the light emitter 42 and the ASIC chip 43. A minimized distance W is arranged between a center of the light emitter 42 and a center of the proximity sensor 431 so that the light emitter 42 and the proximity sensor 431 are adjacent to the barrier 44, and the ASIC chip 43 is arranged with a minimized height $h_3$ to avoid receiving optical noise from other lighting sources other than the light emitter 42.

The ambient light detection chip 45 is separately manufactured and then coupled to the ASIC chip 43, extending to a pre-determined height relative to a laterally extended surface of the ASIC chip 43 and being independently offset in position from the first detection surface 4311 of the proximity sensor 431 to be laterally spaced therefrom so that the first detection surface 4311 is not shielded by the second detection surface 4511. The ambient light detection chip 45 further has a second detection surface 4511. The offset position between the ambient light detection chip 45 and the first detection surface 4311 is limited to a minimized distance S between the second detection surface 4511 and the first detection surface 4311, and the height of the ambient light detection chip 45 is arranged to be a maximized height $h_2$ for the second detection surface 4511 to receive ambient light, thereby the ambient light detection chip 45, the light emitter 42 and the proximity sensor 431 are disposed within a limited area of an aperture R to form the complex optical proximity sensor 40. In the embodiment, the ambient light detection chip 45 is a chip for ambient light detection, RGB color detection, or ultraviolet (UV) detection.

In this embodiment, the minimized distance W between the light emitter 42 and the proximity sensor 431 is arranged between 0.5 mm to 2.0 mm, and the minimized distance S of the offset between the ambient light detection chip 45 and the first detection surface 4311 of the proximity sensor 431 is arranged between 0 mm to 1 mm. The minimized height $h_3$ of the ASIC chip 43 is arranged between 0.05 mm to 0.3 mm, and the maximized height $h_2$ of the ambient light detection chip 45 is arranged between 0 mm to 1 mm or shorter than a difference between a height $h_1$ of the barrier 44 and the minimized height $h_3$ of the ASIC chip 43.

The ASIC chip 43 includes a plurality of first connect points 432 disposed at right side of the ambient light detection chip 45 and the first detection surface 4311, forming an opening 4321 toward the ambient light detection chip 45 and the first detection surface 4311. The ambient light detection chip 45 includes a plurality of second connect points 451 disposed at right side of the ambient light detection chip 45; the substrate 41 is either a ceramic substrate or a PCB for electric wire connections and includes a third connect point 412 disposed below the light emitter 42 and a plurality of fourth connect points 413 disposed around the ASIC chip 43. The third connect point 412 is mutually coupled with each fourth connect point 413, and each first connect points 432 is electrically connected to one of the second connect points 451 and one of the fourth connect points 413 for the ASIC chip 43, the ambient light detection chip 45 and the substrate 41 to be mutually coupled. The third connect point 412 is further electrically connected to the light emitter 42 which is coupled to the ASIC chip 43 via the fourth connect points 413. In this embodiment, the first connect points 432, second connect points 451, third connect point 412, and fourth connect points 413 are arranged in accordance to position of the ambient light detection chip 45, light emitter 42, and proximity sensor 431 for performing detection within the limited area of an aperture R.

Figure 10:
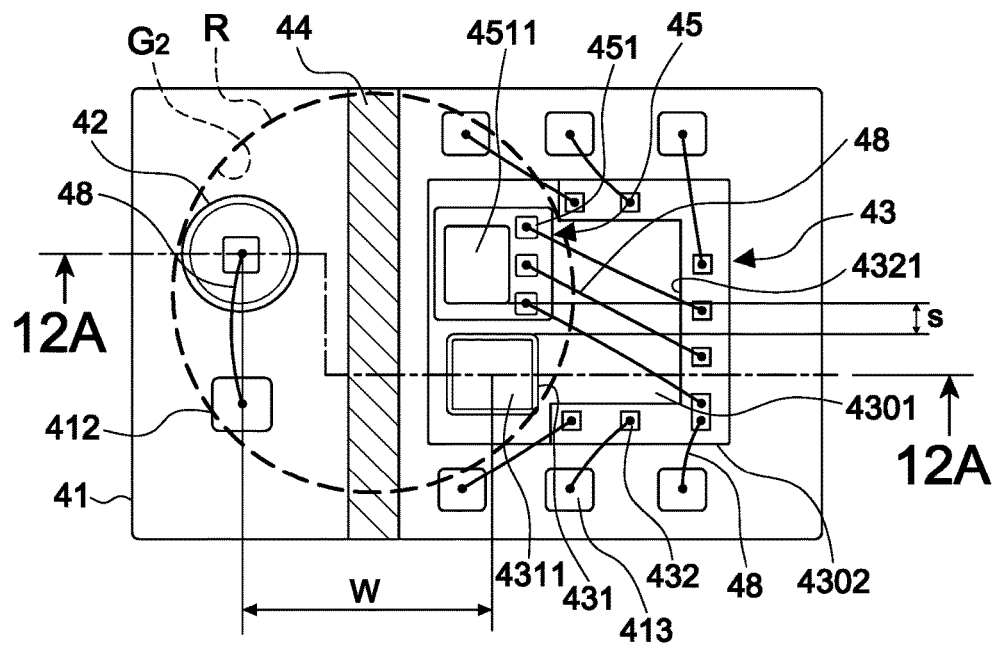
FIG. 10 is a top plan view of the present invention.
Figure 11:
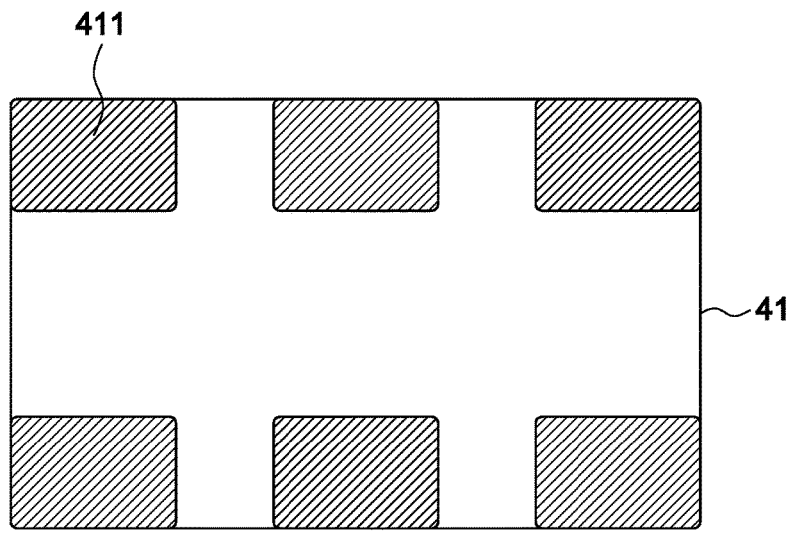
FIG. 11 is a bottom plan view of the present invention.
Figure 12A:
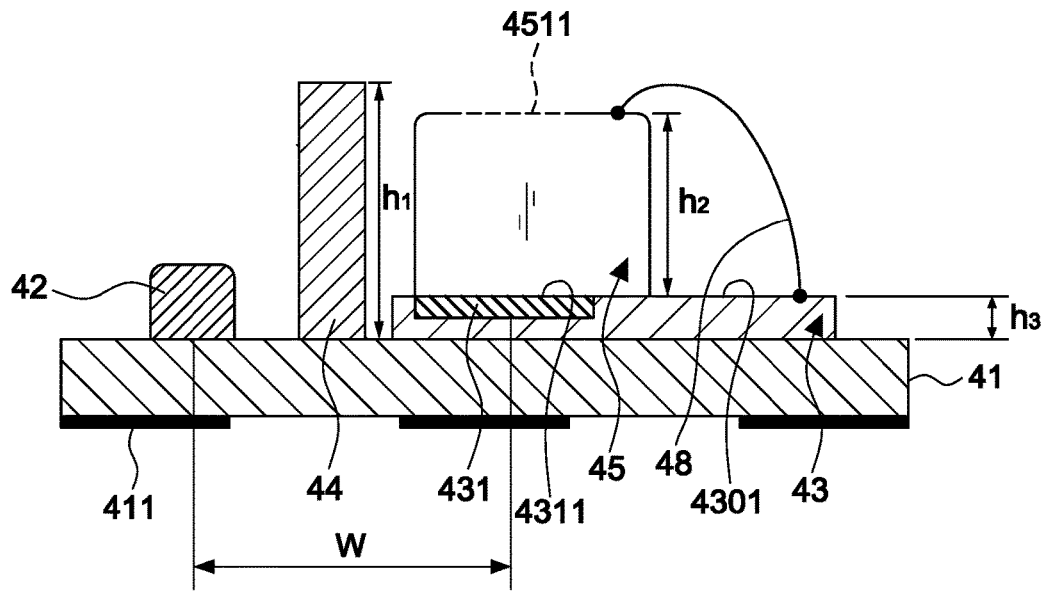
FIG. 12A is a sectional view along ling 12A-12A in FIG. 10.

As shown in FIGS. 10 and 12A, the ambient light detection chip 45 is separately manufactured and then disposed on and coupled to the ASIC chip 43 to enable adjustment of a distance to the barrier 44 without changing or affecting the circuits on the ASIC chip 43. Further referring to FIG. 11, the substrate 41 has a plurality of bond pads 411 arranged under a bottom thereof to be coupled to the ASIC chip 43 and the light emitter 42, making the complex optical proximity sensor 40 a surface-mount device.

Figure 12B:
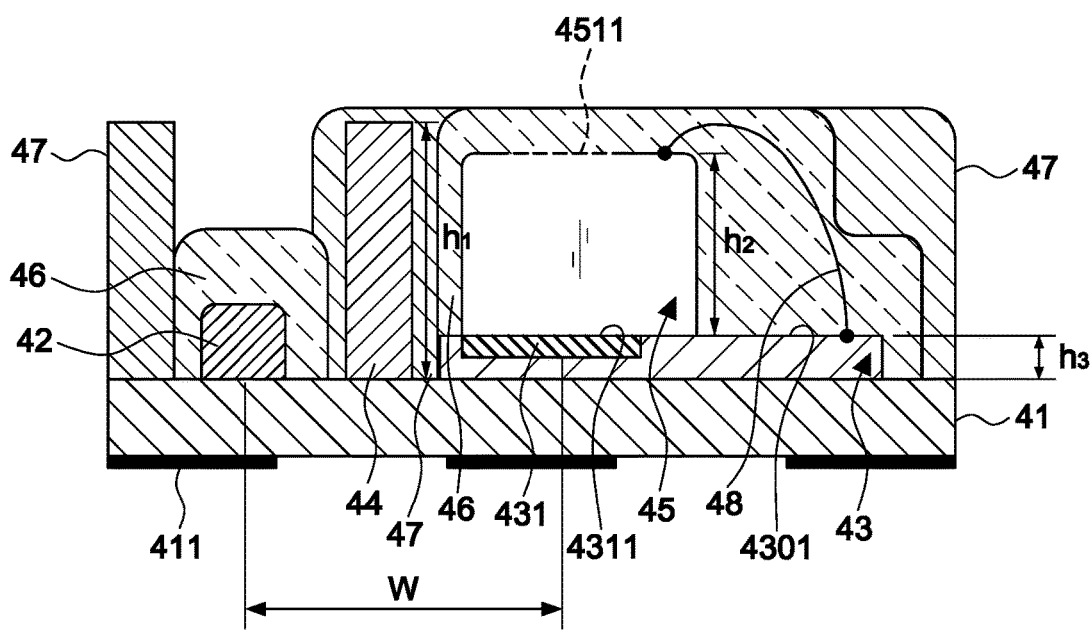
FIG. 12B is a schematic diagram of the present invention.

FIG. 12B shows that a plurality of transparent packages 46 is disposed on the substrate 41 for the ambient light detection chip 45, the ASIC chip 43 and the light emitter 42 to be separately encapsulated therein, and that a non-transparent package 47 is disposed on the substrate 41 for the barrier 44 to be encapsulated therein. In another embodiment, the material of the transparent packages 46 is made of lens, but it is not limited to such application.

Figure 13:
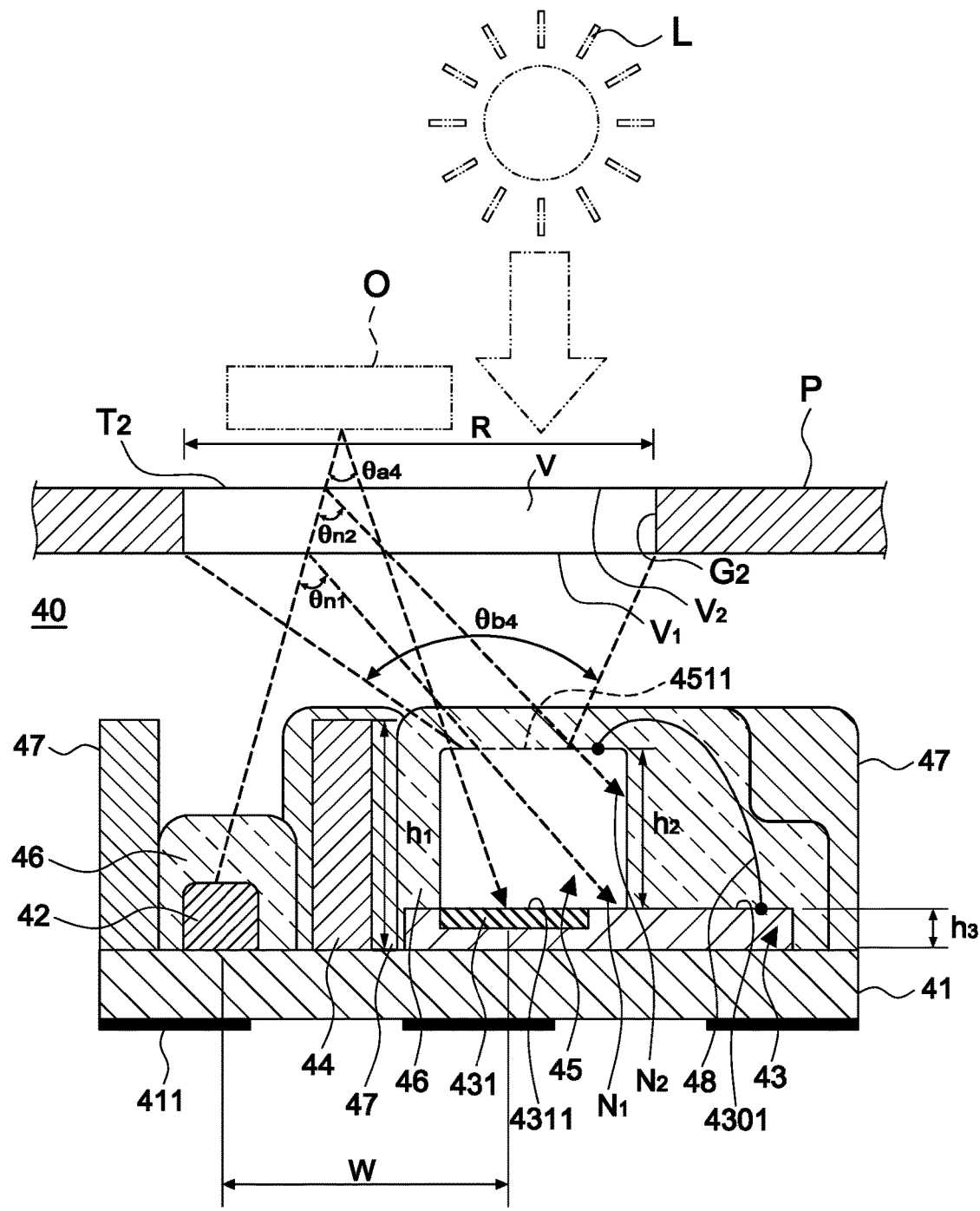
FIG. 13 is a practical application view of the present invention.

As illustrated in FIG. 13, a light is emitted from the light emitter 42 and reflected by an object O to the proximity sensor 431 for detection as the barrier 44 at the pre-determined height $h_1$ disposed to prevent interference from the emitted light to the proximity sensor 431. The height $h_3$ of the ASIC chip 43 is minimized to avoid the first detection surface 4311 receiving optical noise and the height $h_2$ of the ambient light detection chip 45 is maximized and arranged in accordance with the height $h_1$ of the barrier 44 so that the second detection surface 4511 would not be blocked or interfered by the barrier 44 during detection of ambient light L. Thereby the detection angle $\theta_{a4}$ of the proximity sensor 431 within the limited area of an aperture R is minimized and the detection angle $\theta_{b4}$ of the ambient light detection chip 45 within the limited area of an aperture R is maximized. With a circular opening $G_2$ with a short diameter $T_2$ as the aperture on a front surface of a smartphone P, the ASIC chip 43 is able to receive the light emitted from the light emitter 42 and ambient light L to control the operation of the ambient light detection chip 45, the light emitter 42 and the proximity sensor 431. When a light emitted from the light emitter 42 goes through a glass layer V of the smartphone P, the light is refracted through a first surface $V_1$ of the glass layer V at a first refraction angle $\theta_{n1}$ and produces an optical noise $N_1$; then the light is refracted through a second surface $V_2$ of the glass layer V at a second refraction angle $\theta_{n2}$ and produces an optical noise $N_2$. Since the ASIC chip 43 and the proximity sensor 431 are manufactured in one piece, the height $h_3$ of the ASIC chip 43 is close to the first detection surface 4311 of the proximity sensor 431 and the height $h_2$ of the ambient light detection chip 45 is maximized. The complex optical proximity sensor 40 therefore would not detect the optical noises $N_1$, $N_2$ and the second detection surface 4511 would not be blocked by the barrier 44 during operation.

To further explain the differences between the technologies in the prior art and the present invention in aperture sizes, detection angles $\theta_a$ of the proximity sensor, and detection angles $\theta_b$ of ambient light detection, a table chart is disclosed below.

| | An optical proximity sensing package | A POP optical proximity sensor | A photosensor chip package structure | A conventional optical proximity sensor | Virtual optical proximity sensor | The present invention |
|---|---|---|---|---|---|---|
| Opening of an aperture | Large | Large | Small | Large | Small | Extremely Small |
| Proximity detection angle θa | Medium | Medium | Narrow | Medium | Narrow (optical noises detected) | Narrow (optical noises undetected) |
| Ambient light detection angle θb | Medium | Wide | Narrow | Wide | Wide | Wide |

The present invention has the minimized distance W and the minimized distance S of the offset position between the ambient light detection chip 45 and the first detection surface 4311 to form the limited area of an aperture R. The minimized height $h_3$ of the ASIC chip 43 is close to the first detection surface 4311 of the proximity sensor 431 to prevent from receiving optical noises. On the other hand, the height $h_2$ of the ambient light detection chip 45 is maximized to prevent from blocking by the barrier 44. These structures are integrated to form the complex optical proximity sensor 40.

Figure 14:
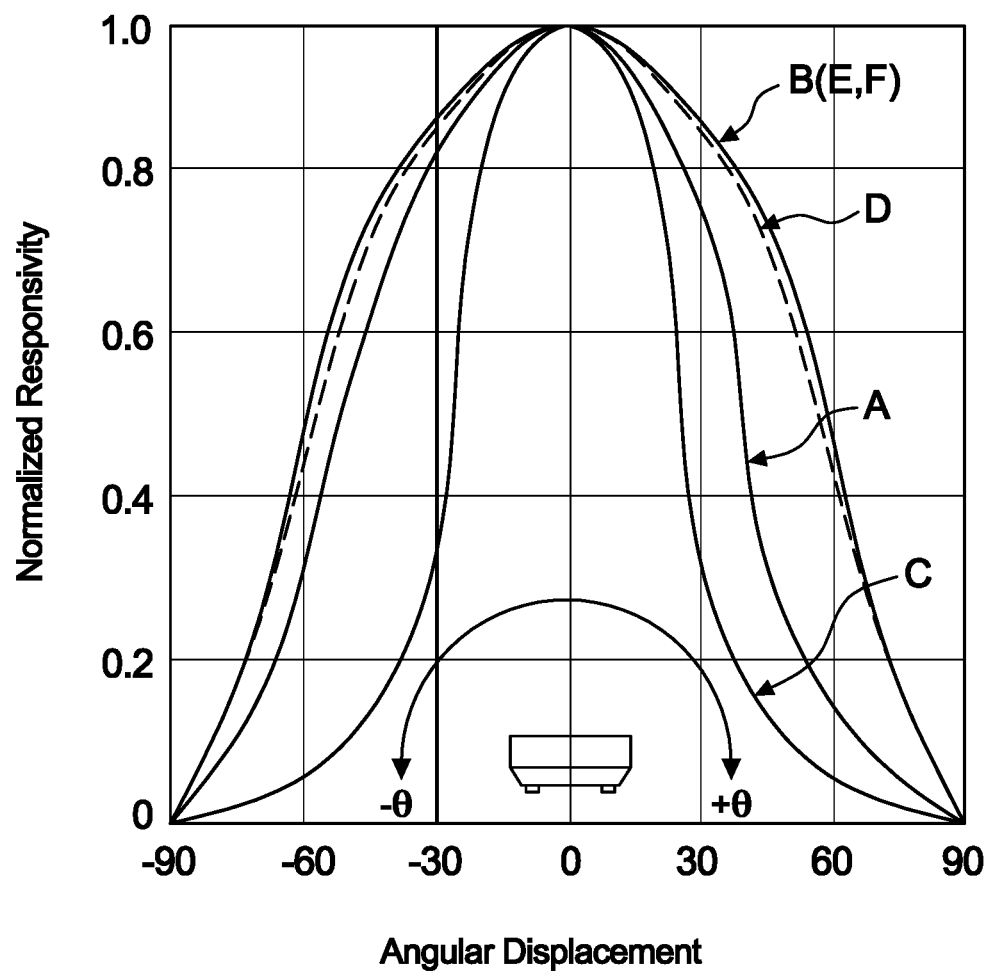
FIG. 14 is a curve diagram of angular displacement comparison of ambient light detection between the present invention and the prior arts.

With reference to FIG. 14, further analysis and clarification of the differences are described as following.

1. Curve A shows an angular displacement of ambient light detection in an optical proximity sensing package structure. A PS thereof is disposed close to the left of an ALS thereof so the proximity detection angle cannot be too narrow, and the ALS cannot reach a wide angle for ambient light detection either due to arrangement of a barrier; plus, such structure has the ALS and PS arranged laterally. Therefore, it requires an elongated hole to be arranged on a front surface of a smartphone with a large aperture.

2. Curve B shows an angular displacement of ambient light detection in a POP optical proximity sensor. The ambient light detection angle can be wide without a blocking element, but the proximity detection angle remains unchanged comparing to the structure in an optical proximity sensing package. Therefore, it still requires an elongated hole on a front surface of a smartphone with a large aperture.

3. Curve C shows an angular displacement of ambient light detection in a photosensor chip package structure. The proximity detection angle and the ambient light detection angle become narrower with the PS and ALS thereof disposed in different basins. Thus an opening on a smartphone for its application is a circular hole with a small aperture, but the ambient light detection angle is not suitable for operation.

4. Curve E shows an angular displacement of ambient light detection in a conventional optical proximity sensor. The ambient light detection angle of the optical proximity sensor is narrower than the detection angle of the present invention; and since the proximity detection angle cannot be narrower, an opening on a smartphone for the conventional optical proximity sensor to perform detection is an elongated hole, failing to be applied to a device with an aperture as the opening.

5. Curve F shows an angular displacement of ambient light detection in a virtual optical proximity. The proximity detection of this device is narrower, thereby allowing the device to be applied within an aperture as the opening on a smartphone. However, the device can still receive optical noises during operation.

6. Curve D shows an angular displacement of ambient light detection in the present invention. The complex optical proximity sensor 40 has a minimized proximity detection angle $\theta_a$ and a maximized ambient light detection angle $\theta_b$. Therefore, the curve D overlaps curves E and F. With such structures, the complex optical proximity sensor 40 can operate within a circular opening $G_2$ with a short diameter $T_2$ as the aperture on a front surface of a smartphone P without being interfered by optical noises.

What is claimed is:

1. A complex optical proximity sensor, comprising:
   a substrate;
   a light emitter coupled to the substrate;
   an application-specific integrated circuit chip disposed on the substrate and coupled thereto;
   a proximity sensor embedded in said application-specific integrated circuit chip and electrically connected therewith, said proximity sensor having a first detection surface sharing a common level surface with an upper surface of said application-specific integrated circuit chip, said substrate further including a barrier mounted thereon between the light emitter and the application-specific integrated circuit chip, wherein a minimized distance is arranged between a center of the light emitter and a center of the proximity sensor so that the light emitter and the proximity sensor are adjacent to the barrier, and the application-specific integrated circuit chip is arranged with a minimized height to avoid receiving optical noise from other lighting sources other than the light emitter; and an ambient light detection chip separately manufactured and then coupled to the application-specific integrated circuit chip, the ambient light detection chip extending to a pre-determined height relative to a laterally extended surface of the application-specific integrated circuit chip; said ambient light detection chip having a second detection surface and being independently offset in position from the first detection surface of the proximity sensor for the first detection surface to be laterally spaced without being shielded by said second detection surface, wherein the offset position between the ambient light detection chip and the first detection surface of the proximity sensor is limited to a minimized distance between the second detection surface and the first detection surface, and the height of the ambient light detection chip is arranged to be a maximized height for the second detection surface to receive ambient light, thereby the ambient light detection chip, the light emitter and the proximity sensor are disposed within a limited area of an aperture to form the complex optical proximity sensor;

whereby a light is emitted from the light emitter and reflected to the proximity sensor for detection; the barrier is arranged at a pre-determined height to prevent interference from the emitted light to the proximity sensor and the application-specific integrated circuit chip is arranged with the minimized height to prevent the first detection surface of the proximity sensor from receiving optical noise; and the ambient light detection chip is manufactured separately with the maximized height in accordance with the height of the barrier to minimize a detection angle of the proximity sensor and to maximize a detection angle of the ambient light detection chip with the first and second detection surfaces performing detections within the limited area of an aperture.

2. The complex optical proximity sensor as claimed in claim 1, wherein the minimized distance between the light emitter and the proximity sensor is arranged between 0.5 mm to 2.0 mm, and the minimized distance of the offset between the ambient light detection chip and the first detection surface of the proximity sensor is arranged between 0 mm to 1 mm.

3. The complex optical proximity sensor as claimed in claim 2, wherein the minimized height of the application-specific integrated circuit chip is arranged between 0.05 mm to 0.3 mm, and the maximized height of the ambient light detection chip is arranged between 0 mm to 1 mm.

4. The complex optical proximity sensor as claimed in claim 2, wherein the minimized height of the application-specific integrated circuit chip is arranged between 0.05 mm to 0.3 mm, and the maximized height of the ambient light detection chip is arranged shorter than a difference between the height of the barrier and the minimized height of the application-specific integrated circuit chip.

5. The complex optical proximity sensor as claimed in claim 1, wherein the ambient light detection chip is a chip for ambient light detection, RGB color detection, or ultraviolet (UV) detection.

6. The complex optical proximity sensor as claimed in claim 1, wherein the light emitter is a LED, a laser diode (LD), or a vertical-cavity surface-emitting laser (VCSEL).

7. The complex optical proximity sensor as claimed in claim 1, wherein the application-specific integrated circuit chip includes a plurality of first connect points disposed at right side of the ambient light detection chip and the first detection surface, forming an opening toward the ambient light detection chip and the first detection surface; the ambient light detection chip includes a plurality of second connect points disposed at right side of the ambient light detection chip; the substrate is either a ceramic substrate or a PCB for electric wire connections and includes a third connect point disposed below the light emitter and a plurality of fourth connect points disposed around the application-specific integrated circuit chip, said third connect point mutually coupled with each fourth connect point, each first connect points electrically connected to one of said second connect points and one of the fourth connect points for the application-specific integrated circuit chip, the ambient light detection chip and the substrate to be mutually coupled, said third connect point further electrically connected to said light emitter which is coupled to the application-specific integrated circuit chip via the fourth connect points; said first connect points, second connect points, third connect point, and fourth connect points arranged in accordance to position of said ambient light detection chip, light emitter, and proximity sensor for performing detection within said limited area of an aperture.

8. The complex optical proximity sensor as claimed in claim 7, wherein the substrate has a plurality of bond pads arranged under a bottom thereof to be coupled to the application-specific integrated circuit chip and the light emitter, making the complex optical proximity sensor a surface-mount device.

9. The complex optical proximity sensor as claimed in claim 1, wherein the substrate has a plurality of transparent packages for the ambient light detection chip, the application-specific integrated circuit chip and the light emitter to be separately encapsulated therein.

10. The complex optical proximity sensor as claimed in claim 9, wherein the material of transparent packages is made of lens.

11. The complex optical proximity sensor as claimed in claim 1, wherein the substrate further has a non-transparent package for the barrier to be encapsulated therein.

12. A manufacturing method of the complex optical proximity sensor as claimed in claim 1, comprising:
 a) providing a substrate;
 b) providing a light emitter coupled to the substrate;
 c) providing an application-specific integrated circuit chip disposed on the substrate and coupled thereto;
 d) providing a proximity sensor embodied in said application-specific integrated circuit chip and electrically connected therewith, said proximity sensor having a first detection surface sharing a common level surface with an upper surface of said application-specific integrated circuit chip, said substrate further including a barrier mounted thereon between the light emitter and the application-specific integrated circuit chip,
 wherein a minimized distance is arranged between a center of the light emitter and a center of the proximity sensor so that the light emitter and the proximity sensor are adjacent to the barrier, and the application-specific integrated circuit chip is arranged with a minimized height to avoid receiving optical noise from other lighting sources other than the light emitter; and e) providing an ambient light detection chip separately manufactured and then coupled to the application-specific integrated circuit chip, the ambient light detection chip extending to a pre-determined height relative to a laterally extended surface of the application-specific integrated circuit chip; said ambient light detection chip having a second detection surface and being independently offset in position from the first detection surface of the proximity sensor to be laterally spaced therefrom without being shielded, wherein the offset position between the ambient light detection chip and the first detection surface of the proximity sensor is limited to a minimized distance between the second detection surface and the first detection surface, and the height of the ambient light detection chip is arranged to be a maximized height for the second detection surface to receive ambient light, thereby the ambient light detection chip, the light emitter and the proximity sensor are disposed within a limited area of an aperture to form the complex optical proximity sensor;

whereby a light is emitted from the light emitter and reflected to the proximity sensor for detection; the barrier is arranged at a pre-determined height to prevent interference from the emitted light to the proximity sensor and the proximity sensor is arranged with the minimized height to prevent the first detection surface thereof from receiving optical noise; and the ambient light detection chip is manufactured separately with the maximized height in accordance with the height of the barrier to minimize a detection angle of the proximity sensor and to maximize a detection angle of the ambient light detection chip with the first and second detection surfaces performing detections within the limited area of an aperture.

13. The method as claimed in claim 12, wherein the minimized distance between the light emitter and the proximity sensor is arranged between 0.5 mm to 2.0 mm, and the minimized distance of the offset between the ambient light detection chip and the first detection surface of the proximity sensor is arranged between 0 mm to 1 mm.

14. The method as claimed in claim 13, wherein the minimized height of the proximity sensor is arranged between 0.05 mm to 0.3 mm, and the maximized height of the ambient light detection chip is arranged between 0 mm to 1 mm.

15. The method as claimed in claim 13, wherein the minimized height of the application-specific integrated circuit chip is arranged between 0.05 mm to 0.3 mm, and the maximized height of the ambient light detection chip is arranged shorter than a difference between the height of the barrier and the minimized height of the application-specific integrated circuit chip.

16. The method as claimed in claim 12, wherein the application-specific integrated circuit chip includes a plurality of first connect points disposed at right side of the ambient light detection chip and the first detection surface, forming an opening toward the ambient light detection chip and the first detection surface; the ambient light detection chip includes a plurality of second connect points disposed at right side of the ambient light detection chip; the substrate is either a ceramic substrate or a PCB for electric wire connections and includes a third connect point disposed below the light emitter and a plurality of fourth connect points disposed around the application-specific integrated circuit chip, said third connect point mutually coupled to each fourth connect point, each first connect points electrically connected to one of said second connect points and fourth connect points for the application-specific integrated circuit chip, the ambient light detection chip and the substrate to be mutually coupled, said third connect point further electrically connected to said light emitter which is coupled to the application-specific integrated circuit chip via the fourth connect points; said first connect points, second connect points, third connect point, and fourth connect points arranged in accordance to position of said ambient light detection chip, light emitter, and proximity sensor for performing detection within said limited area of an aperture.

* * * * *